United States Patent [19]

Bhattacharyya et al.

[11] Patent Number: 5,488,257

[45] Date of Patent: Jan. 30, 1996

[54] MULTILAYER MOLDED PLASTIC PACKAGE USING MESIC TECHNOLOGY

[75] Inventors: Bidyut Bhattacharyya; Debendra Mallik, both of Chandler, Ariz.

[73] Assignee: Intel Corporation, Santa Clara, Calif.

[21] Appl. No.: 384,629

[22] Filed: Feb. 6, 1995

Related U.S. Application Data

[63] Continuation of Ser. No. 108,766, Aug. 18, 1993, abandoned, which is a continuation of Ser. No. 837,285, Feb. 18, 1992, abandoned.

[51] Int. Cl.$^6$ .......................... H01L 23/48; H01L 29/44; H01L 29/52
[52] U.S. Cl. .......................... 257/774; 257/666; 257/528; 257/531; 257/904
[58] Field of Search .......................... 257/667, 664, 257/676, 691, 700, 904, 528, 531, 532, 535, 536, 537, 666, 784, 774, 758, 759; 361/772, 776, 782, 783, 811, 813

[56] References Cited

U.S. PATENT DOCUMENTS

| | | |
|---|---|---|
| 4,835,120 | 5/1989 | Mallik et al. . |
| 4,868,640 | 9/1989 | Shiné .......................... 257/666 |
| 4,891,687 | 1/1990 | Mallik . |
| 4,949,163 | 8/1990 | Sudo et al. .......................... 257/904 |
| 5,025,114 | 6/1991 | Braden .......................... 257/676 |
| 5,067,005 | 11/1991 | Michii et al. .......................... 257/700 |
| 5,235,209 | 8/1993 | Shimizu et al. .......................... 257/700 |
| 5,243,496 | 9/1993 | Mermet-Guyennet .......................... 361/813 |

FOREIGN PATENT DOCUMENTS

| | | |
|---|---|---|
| 3626151A1 | 2/1988 | Germany . |
| 0278227 | 4/1990 | Germany .......................... 257/532 |
| WO91/06978 | 5/1991 | WIPO . |
| 0457593A2 | 11/1991 | WIPO . |
| 0459179A1 | 12/1991 | WIPO . |
| 0474469A1 | 3/1992 | WIPO . |
| 0484257A1 | 5/1992 | WIPO . |

OTHER PUBLICATIONS

*IBM Technical Disclosure Bulletin*, R. O. Lussow, "Internal Capacitors and Resistors for Multilayer Ceramic Modules", vol. 20, No. 9, pp. 3436–3437, Feb. 1978.
*Sixth IEEE/CHMT International Electronic Manufacturing Technology Symposium*, "Proceedings 1989 Japan IEMT Symposium", pp. 220–229. Apr. 26–28, 1989.
*Abstracts of Japan*, M. Fujimoto, "Semiconductor Integrated Device", vol. 11, No. 73, Mar. 5, 1987.

*Primary Examiner*—Sara W. Crane
*Assistant Examiner*—Carl Whitehead, Jr.
*Attorney, Agent, or Firm*—Blakely, Sokoloff, Taylor & Zafman

[57] ABSTRACT

A method and resulting structure for constructing an IC package utilizing thin film technology. The package has a bottom conductive plate that has a layer of ceramic vapor deposited onto the plate in a predetermined pattern. Adjacent to the insulative layer of ceramic is a layer of conductive metal vapor deposited onto the ceramic. The layer of metal can be laid down onto the ceramic in a predetermined pattern to create a power plane, a plurality of signal lines, or a combination of power planes and signal lines. On top of the layer of conductive material is a lead frame separated by a layer of insulative polyimide material. The polyimide material has a plurality of holes filled with a conductive material, which electrically couple the layer of conductive material with the leads of the lead frame. The power and ground pads of the integrated circuit are connected to the layer of vapor deposited conductive material and conductive plate, which are also coupled to the corresponding leads of the lead frame, thereby connecting the IC to the leads of the lead frame. The signal pads of the IC are connected to the lead frame and/or signal lines formed within the layer of vapor deposited conductive material. The IC and attached circuit package can then be encapsulated in a plastic shell.

10 Claims, 3 Drawing Sheets

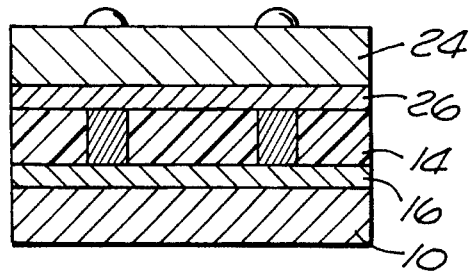
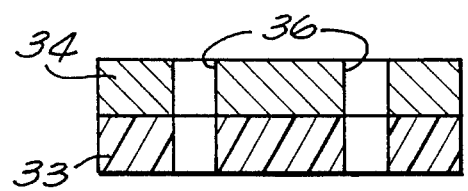
FIG. 6    FIG. 7
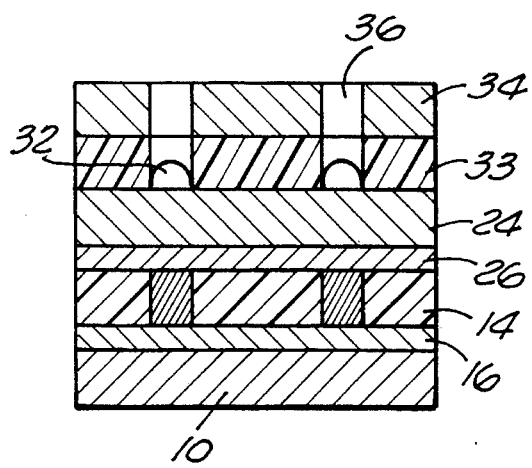
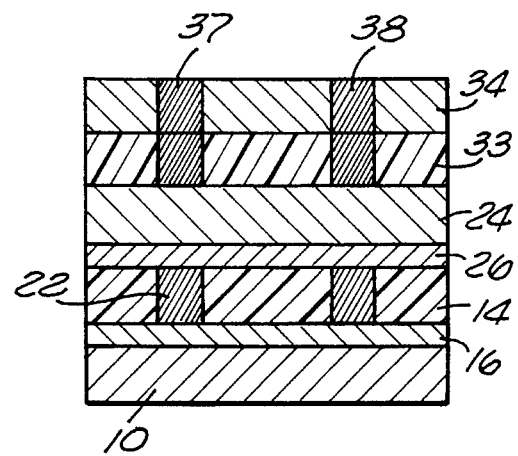
FIG. 8    FIG. 9
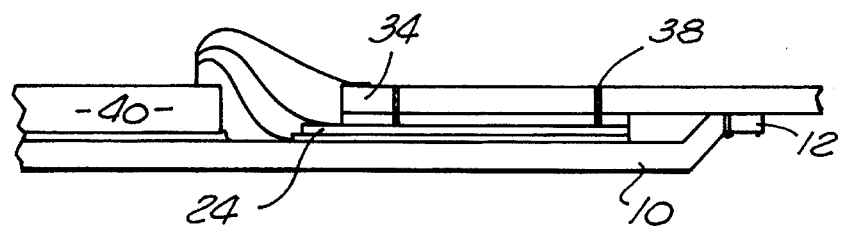
FIG. 10

MULTILAYER MOLDED PLASTIC PACKAGE USING MESIC TECHNOLOGY

This is a continuation of application Ser. No. 08/108,766 filed Aug. 18, 1993 now abandoned, which is a continuation of Ser. No. 07/837,285 filed Feb. 18, 1992 now abandoned.

BACKGROUND OF THE INVENTION

1. Field of the Invention

The present invention relates to the field of electronic packaging, particularly a method and resulting structure for a high speed chip carrier.

2. Description of the Related Art

High speed computers typically require minimal inductance of the supply power and ground loop for the integrated circuits (ICs) of the system. The ICs are usually mounted into chip carriers which have a plurality of leads that interconnect the chips and the signal, power and ground lines. The power supply leads are typically quite long, whereby there is created an unacceptable amount of inductance between the leads, particularly between the power and ground loop. This problem becomes greater as the speed of the system increases.

U.S. Pat. Nos. 4,891,687 and 4,835,120 issued to Mallik et al, discloses an IC package that has a pair of copper plates bonded to the lead frame of the package. The copper planes are separated by insulative material and have tabs that are connected to designated leads of the lead frame. The power and ground leads of the IC are attached to each conductive plate respectively. Power flows into the package, from the leads, through the plates and into the IC. The creation of separate power and ground planes reduces the inductance and increases the capacitance between power and ground lines. This reduction in impedance is particularly important for high speed circuitry.

Although the dual plane package provides a means of accommodating the noise created by high speed switching signal lines, the specific inductance and capacitance values are somewhat unpredictable because of the size and tolerances associated with the plates. Furthermore, there is no way of connecting passive components to the lead frame to customize the package. It would therefore be desirable to have an IC package that would allow the designer to control the impedance and thus reduce the creation of noise of the circuit within the package. It would also be desirable to have a method of constructing an IC package that can provide internal routing with the package.

SUMMARY OF THE INVENTION

The present invention is a method and resulting structure for constructing an IC package utilizing thin film technology. The package has a bottom conductive plate that has a layer of oxide vapor deposited onto the plate in a predetermined pattern. Adjacent to the insulative layer of oxide is a layer of conductive metal vapor deposited onto the oxide. The layer of metal can be laid down onto the ceramic in a predetermined pattern to create a power plane, a plurality of signal lines, or a combination of power planes and signal lines. On top of the layer of conductive material is a lead frame separated by a layer of insulative polyimide material. The polyimide material has a plurality of holes filled with a conductive material, which electrically couple the layer of vapor deposited conductive material with the leads of the lead frame. The power and ground pads of the IC are attached to the layer of conductive material and conductive plate, which are also coupled to corresponding leads of the lead frame, thereby connecting the IC to the leads of the lead frame. The signal pads of the IC are connected to the lead frame and/or signal lines formed within the layer of vapor deposited conductive material. The IC and attached circuit package can then be encapsulated in a plastic shell as is known in the art. The use of a thin film layer of insulative oxide material not only reduces the thickness of the package, but increases the dielectric constant and resulting capacitance of the circuit as well.

Additionally, resistive or capacitive material can be vapor deposited onto or between the signal lines of the conductive layer, wherein resistors and capacitors are attached to the individual lines. The inclusion of resistors and capacitors into the package provides a customized controlled line impedance over packages known in the art. The present invention also allows the creation of multiple layers and routing within the package, which is beneficial for packages with two or more ICs. The external routing would allow communication between the multiple chips without having to travel outside of the package. The designer could thus design an infinite combination of signals and power planes within the package itself. The signal lines of the present invention are also spaced closer together, thereby allowing increased pad density on the IC.

The conductive material between the conductive layers and lead frame eliminate the need for the attachment tabs of the prior art, which were cumbersome to produce and assemble. The solidified conductive material, commonly known as vias, also provide more flexibility in the design of the package, allowing the designer to configure a variety of signal and power paths that will reduce the amount of noise in the circuit.

Therefore it is an object of this invention to provide a method of constructing a chip carrier that will allow individual signal lines to be integrally formed into the package structure.

It is also an object of this invention to provide a method and resulting chip carrier that has integrally formed resistors and capacitors connected to the signal lines of the package.

It is also an object of this invention to provide a chip carrier that has power and signal lines with a predetermined impedance value.

It is also an object of this invention to provide a chip carrier that can be used with high speed devices.

It is also an object of this invention to provide a chip carrier that can increase the pad density of an IC.

It is also an object of this invention to provide a chip carrier that can be constructed to have an infinite variety of signal lines and power layout.

BRIEF DESCRIPTION OF THE DRAWINGS

The objects and advantages of the present invention will become more readily apparent to those skilled in the art after reviewing the following detailed description and accompanying drawings, wherein:

FIG. 6 is a side view showing conductive material applied at predetermined locations on the conductive layer of FIG. 4;

FIG. 7 is a side view showing an insulative tape that is attached to a lead frame, wherein the tape and lead frame have holes formed therein;

FIG. 8 is a side view showing the attached tape and lead frame of FIG. 7 placed on top of the conductive layer of FIG. 6;

FIG. 9 is a side view similar to FIG. 8, showing conductive material inserted into the holes of the lead frame and the insulative tape;

FIG. 10 is a side view showing an assembled IC package of the present invention;

DETAILED DESCRIPTION OF THE INVENTION

Figure 1:
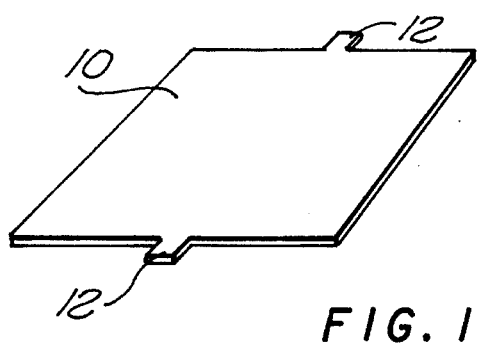
FIG. 1 is a perspective view of a conductive plate.
Figure 2:
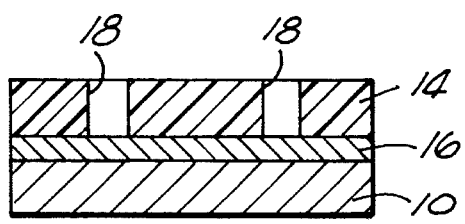
FIG. 2 is a side view showing a ceramic insulative layer that had been vapor deposited onto the conductive plate of FIG. 1, wherein the insulative layer has holes.

Referring to the drawings more particularly by reference numbers, FIG. 1 shows a conductive plate 10. The conductive plate 10 is preferably constructed from copper and may have tabs 12 formed at the ends as shown and described in U.S. Pat. Nos. 4,835,120 and 4,891,687 issued to Mallik et al, which are hereby incorporated by reference. As shown in FIG. 2, a first layer 14 of insulative material is then vapor deposited onto the conductive plate 10. The insulative material is preferably a ceramic such as aluminum oxide which can be vapor deposited with techniques know in the art. The thickness of the ceramic 14 is typically 5–15 microns and has a dielectric constant of approximately 7. In the preferred embodiment, a first layer 16 of nickel is vapor deposited onto the conductive plate 10 before the ceramic, so that the ceramic more readily adheres to the plate 10. The nickel 16 is typically 0.5 microns thick and has an added function of preventing metal migration across the ceramic 14.

Figure 3:
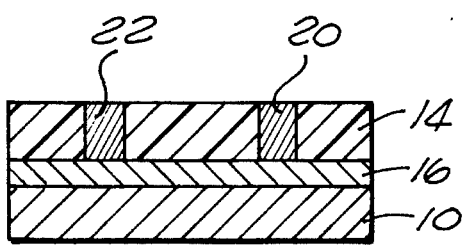
FIG. 3 is a side view showing the holes of the insulative layer filled with conductive material.

In the preferred embodiment, a mask is attached to the conductive plate 10, to prevent the deposition of ceramic onto certain areas of the plate. After the oxide has been deposited, the mask is removed, from the plate. As shown in FIG. 2, the removal of the mask leaves a plurality of holes 18 in the ceramic 14. As shown in FIG. 3, the holes 18 are then filled with a metallic material 20 to create a plurality of vias 22 through the insulative layer 14. The metallic material 20 is preferably a silver epoxy paste that "flows" when elevated to a predetermined temperature and solidifies when cooled down to room temperature. The via holes 18 are typically 50 microns in diameter, but may be smaller or larger depending upon the desired impedance characteristics of the resulting circuitry.

Figure 4:
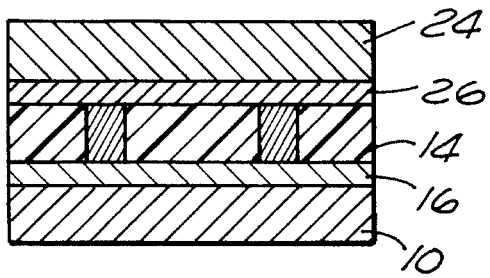
FIG. 4 is a side view showing a conductive layer that had been vapor deposited to the ceramic layer of FIG. 2.

As shown in FIG. 4, a first layer 24 of conductive material is vapor deposited onto the ceramic 14, wherein there may be a second layer 26 of nickel deposited between the ceramic 14 and the conductive layer 24, to increase the adhesion of the conductor 24 to the ceramic 14. The conductive material is preferably copper approximately 5 microns thick. The copper may be deposited such that a power plane is created on top of the insulative layer 14. In the alternative, a mask may be attached to the ceramic 14, to prevent the deposition of metal onto predetermined areas of the insulative layer 14. After the metal is attached, the mask is removed, whereby there is formed a circuit that may have a plurality of signal lines and power planes. The utilization of a mask with the vapor depositing technique allows a designer to construct any pattern of signal lines and power planes.

Figure 5:
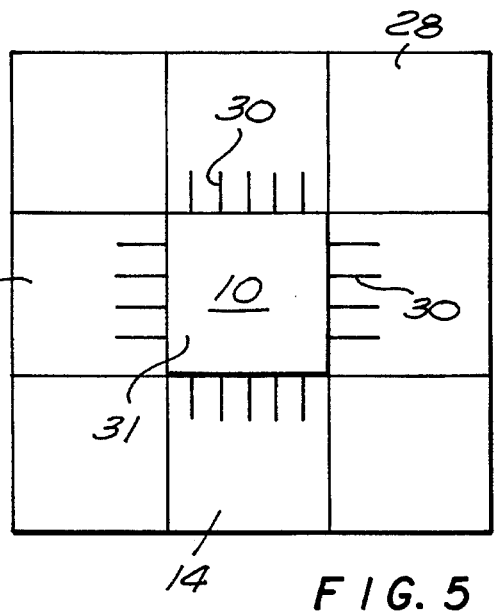
FIG. 5 is a top view of FIG. 4, showing the circuitry constructed on top of the insulative layer.
Figure 5A:
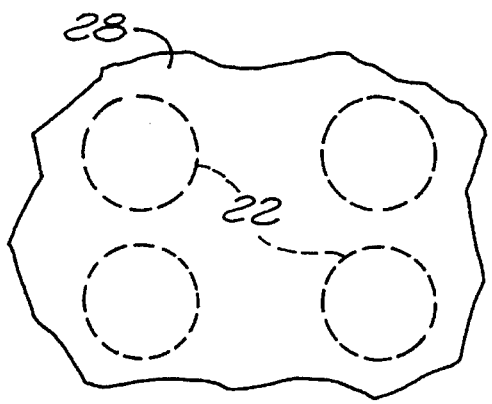
FIG. 5a is a top enlarged view of a power plane of FIG. 5 showing the location of vias relative to the plane.
Figure 5B:
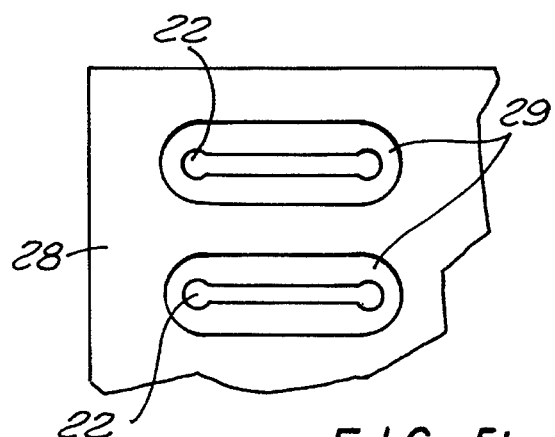
FIG. 5b is a top enlarged view similar to FIG. 5a, showing the vias electrically isolated from the power plane.

As shown in FIG. 5, the circuit may have conductive planes 28 separated from each other and from signal lines 30 that run across the ceramic 14. If vias 22 are utilized, the layer of metal 24 may be deposited on top of the vias 22 to directly couple the conductive plate 10 to the plane 28 as shown in FIG. 5a. As shown in FIG. 5b, the second layer 24 could be deposited so that the vias 22 are separated from the plane 28. This type of configuration allows the conductive planes 28 of the first conductive layer 24 to be electrically isolated from the conductive plate 10, such that the plate 10 can be a ground plane and the conductive planes 28 can be power planes. The vias 22 are then connected to pads 29 which provides interconnection to a subsequent layer of conductive material. The ceramic and conductive layer are masked off so that the center 31 of the plate 10 is not covered by either material. The exposed center section 31 allows a chip to be attached directly to the plate 10. The process of depositing ceramic, creating vias and depositing copper can be repeated to create a plurality of conductive layers. Each layer may have a distinct pattern of signal lines and power planes. The creation of multiple layers is particularly useful when multiple ICs are incorporated, wherein the various ICs can be interconnected within the package.

As shown in FIG. 6, after the top layer of conductive material 32 is deposited, balls of conductive material can be applied to the conductive layer 24 in a predetermined pattern. The conductive material is preferably silver epoxy paste as described above. The paste can be applied with either a single dispenser that sequentially places the balls, or the paste may be applied with the use of a template that has holes corresponding with the placement of the conductive material.

As shown in FIG. 7 a second insulative layer 33 is attached to a lead frame 34. The lead frame 34 has a plurality of individual leads as is known in the art. The insulative layer 33 is preferably a polyimide tape which has an adhesive coating on both sides. Such a tape is sold by E. I. du Pont de Numours & Co. under the trademark KAPTON. The tape 33 and lead frame 34 can be attached and trimmed per the method disclosed in the Mallik patents. Holes 36 are drilled through the lead frame 34 and tape 33 either before or after the attachment of the two members. The holes of the lead frame 34 can either be mechanically drilled or chemically etched. The holes of the tape 33 can be chemically etched, or drilled with either a laser or a mechanical drill.

As shown in FIG. 8, the attached lead frame 34 and tape 33 is then placed on top of the first conductive layer 24, such that the holes 36 are aligned with the conductive balls 32. Conductive material 37 is then inserted into the holes 36, to fill the holes 36 which creates a plurality of second vias 38, as shown in FIG. 9. The second vias 38 electrically couple the leads of the lead frame 34 to the first conductive layer 24. The assembly 40 is then heated until the conductive material and adhesive on the KAPTON flows, whereby the adhesive attaches the tape 33 to the lead frame 34 and the adjacent layers of copper 24 and ceramic 14. If the tabs 12 are incorporated into the plate 10, the tabs 12 can also be pressure welded to the desired leads of the lead frame 34. As an alternate embodiment, hole 36 can be formed in the tape 33 but not the lead frame 34. With such an embodiment, the conductive balls 32 can be placed in the holes 36 of the tape 33 after the tape 33 and lead frame 34 are attached, but before the tape 33 is placed on the conductive layer 24. The conductive balls 32 form vias that couple the conductive layer 24 to the bottom surface of the leads.

Figure 11:
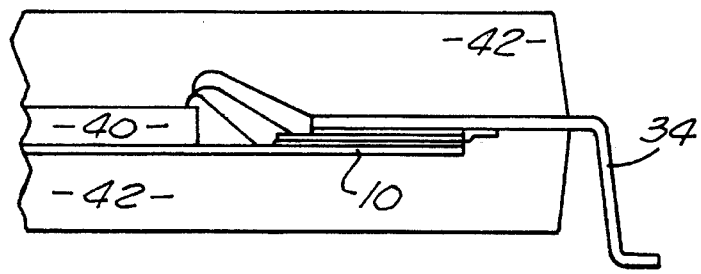
FIG. 11 is a side view showing the assembled IC package of FIG. 10 encapsulated by two plastic shells.

As shown in FIG. 10, a silicon die 40 incorporating an integrated circuit can be mounted into the center section 31 of the plate 10 and the pads of the die 40 can be wire bonded to the corresponding leads 34, conductive layer 24 and plate 10. The assembled die can then be encapsulated with a plastic shell 42, as shown in FIG. 11, with methods known in the art. The ground pads of the die 40 can be attached to the plate 10. The plate 10 couples the ground pads to corresponding ground leads of the lead frame 34, either through the first 22 and second 38 vias, the tabs 12, or both depending upon the embodiment employed. The power pads of the die 40 are electrically coupled to corresponding power leads of the lead frame 34, through the power planes 28 of the first conductive layer 24 and the second vias 38. Likewise, the signal pads of the die 40 can be coupled to the corresponding leads of the lead frame 34, through the signal lines 30 in the first conductive layer 24 and the second vias 38. The signal pads of the die 40 can also be connected directly to the leads 34, as shown in FIG. 10. Routing the signal lines 30 through the first conductive layer 24 further reduces the amount of crosstalk between the lines, because of the short distances in which the lines are parallel with each other.

Figure 12:
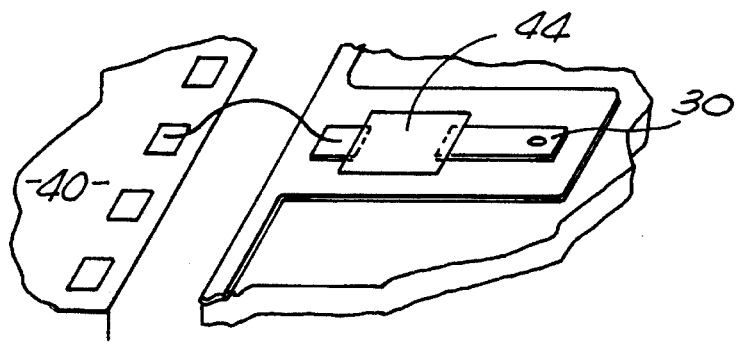
FIG. 12 is a top view of the conductive layer, showing the incorporation of a thin film resistor connected to a signal line.
Figure 13:
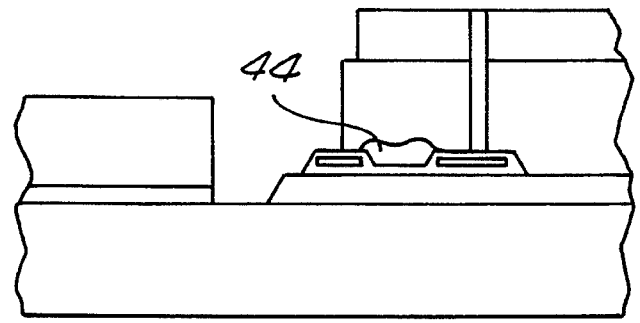
FIG. 13 is a side view similar to FIG. 10, showing the resistor of FIG. 12 between the conductive layer and insulative tape.
Figure 14:
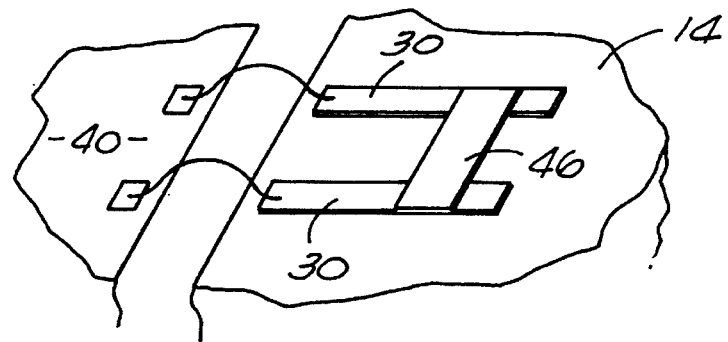
FIG. 14 is a top view similar to FIG. 12, showing the incorporation of a thin film capacitor connected between two signal lines.

FIG. 12 shows an alternate embodiment, wherein a resistor 44 is connected to a signal line 30 to increase the resistance of the line. The resistor 44 can be created by vapor depositing a resistive material such as nickel-chromium or tantalum nitride, to the first conductive layer 24 before the tape 33 and lead frame 34 are attached. The thickness of the vapor deposited resistive material is typically in the range of 100–5000 angstroms. In the alternative, a thick film of carbon can be screened onto the signal lines to create the resistor 44. The resistor 44 can be constructed to be in series with a signal line, with two signal lines, or the resistor 44 may be parallel with two lines, etc. The integration of the resistor 44 into the IC package is more clearly shown in FIG. 13. As shown in FIG. 14, a capacitor 46 can be created between two signal lines 30. The capacitor 46 can be constructed by vapor depositing a dielectric material such as tantalum oxide into the space between the lines. Capacitors 46 can also be placed in between two power planes in the first conductive layer 24. The present invention thus allows the circuit designer to customize the circuit so that each signal line 30 and power plane 28 can have a predetermined impedance. The addition of resistors 44 and capacitors 46 provides a more controllable manner of establishing a predictable impedance value, which is particularly important for high speed circuits.

While certain exemplary embodiments have been described in detail and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An integrated circuit package that houses an integrated circuit, comprising:

a conductive plate;

a first insulative layer that is adjacent to said conductive plate;

a first conductive layer that is adjacent to said first insulative layer;

a lead frame having a plurality of conductive leads;

a layer of polyimide located between said first conductive layer and said lead frame;

a via that extends through said lead frame and said polyimide layer said via containing an electrically conductive material which electrically connects said lead frame to said first conductive layer;

a passive element located on said first insulative layer and coupled to said first conductive layer; and, first connector means for electrically coupling said conductive plate with said lead frame.

2. The package as recited in claim 1, further comprising second connector means for coupling the integrated circuit with said conductive plate, said first conductive layer and said lead frame.

3. The package as recited in claim 2, further comprising a plastic shell that encapsulates the integrated circuit, said conductive plate, said first and second insulative layers, said first conductive layer, said lead frame and said first and second connector means.

4. The package as recited in claim 1, wherein said first conductive layer has at least one power plane.

5. The package as recited in claim 1, wherein said first conductive layer has at least one signal line.

6. The package as recited in claim 5, wherein said first conductive layer has at least one resistor integrally connected to said signal line and electrically coupled to the integrated circuit.

7. The package as recited in claim 5, wherein said first conductive layer has at least one capacitor integrally connected to said signal line and electrically coupled to the integrated circuit.

8. The package as recited in claim 1, wherein said first connector means includes at least one tab extending from said conductive plate, that is attached to said lead frame.

9. The package as recited in claim 1, wherein said first connector means is at least one via within said first insulative layer that electrically couples said conductive plate to said first conductive layer.

10. The package as recited in claim 9, further comprising at least one third insulative layer that separates at least one second conductive layer from said first conductive layer and separates consecutive second conductive layers from each other, wherein there is at least one via that electrically couples said conductive layers.

\* \* \* \* \*